United States Patent [19]
Ting et al.

[11] Patent Number: 5,703,832
[45] Date of Patent: Dec. 30, 1997

[54] $T_{RAS}$ PROTECTION CIRCUIT

[75] Inventors: Tah-Kang Joseph Ting; Ching-Chih Hsieh, both of Hsinchu; Bor-Doou Rong, Chupei, all of Taiwan

[73] Assignee: Etron Technology, Inc., Hsin-Chu, Taiwan

[21] Appl. No.: 808,267

[22] Filed: Feb. 28, 1997

[51] Int. Cl.[6] .................................................. G11C 7/00
[52] U.S. Cl. .................................. 365/233; 365/194
[58] Field of Search ............................ 365/233, 194, 365/195, 189.01

[56] References Cited

U.S. PATENT DOCUMENTS

| | | | |
|---|---|---|---|
| 4,998,222 | 3/1991 | Sussman | 365/203 |
| 5,185,719 | 2/1993 | Dhong et al. | 365/189.01 |
| 5,522,064 | 5/1996 | Aldereguia et al. | 395/550 |
| 5,544,115 | 8/1996 | Ikeda | 365/233 |
| 5,563,831 | 10/1996 | Ting | 365/189.09 |
| 5,617,362 | 4/1997 | Mori et al. | 365/233 |

*Primary Examiner*—Vu A. Le
*Attorney, Agent, or Firm*—George O. Saile; Stephen B. Ackerman

[57] ABSTRACT

Circuits and methods are disclosed to protect dynamic random access memory cell data from being destroyed when the minimum $t_{RAS}$ specification is not being adhered to, by holding off the already issued Row Precharge command until such time that $t_{RAS}$ is satisfied. The memory cell data is getting protected by providing a timing reference circuit with a delay τ, where this delay tracks the bitline restore time of the memory array cell, a row activation control logic which holds off the row precharge cycle until time τ has elapsed, insuring that the bitline signals are fully restored, and an internal circuitry which provides a high isolation voltage for the bitline isolation devices and for a charging transistor in the timing reference circuit.

18 Claims, 8 Drawing Sheets

$T_{RAS}$ PROTECTION CIRCUIT

RELATED PATENT APPLICATION

ETRON96-004, A ROW ACTIVATION CONTROL LOGIC FOR SEMICONDUCTOR MEMORY ARRAYS title filing sate Feb. 08,1997, Ser. No. 08/808,205, assigned to a common assignee.

BACKGROUND OF THE INVENTION

1. Field of the Invention

The invention relates to timing circuits for semiconductor memory arrays, and in particular to the duration $t_{RAS}$ of the row activation command and how it relates to the integrity of the cell data of a dynamic random access memory.

2. Description of the Prior Art

The memory cycle of semiconductor memory arrays is divided into a ROW ACTIVATION (active period) and a ROW PRECHARGE period (inactive period). During row activation the memory cells are accessed and during row precharge the bitlines and inverse bitlines, which were at a high or low voltage depending on the state of the cell, must be precharged to an initial voltage to be ready for the next active period. During row activation the bitline signals get restored and data is read. During row precharge the bitlines get precharged to get ready for the next row activation. If for some reason the row activation time is shortened beyond the minimum specified time $t_{RAS}$ and the row precharge command is issued, bitlines will be precharged. Since the bitline signals are not fully restored dynamic random access memory (DRAM) cell data will be destroyed.

A number of U.S. Patents deal with row activation and precharge timing in memory arrays. U.S. Pat. No. 4,998,222 (Sussman) discloses the use of an internally gated RAS signal to allow for the elimination of the need to skew the beginning of Precharge due to process variation. This patent uses a different circuit than the present invention and does not appear to allow a Row Precharge command to be issued before the $t_{RAS}$ specification is met, as in the present invention. U.S. Pat. No. 5,185,719 (Dong et al.) discloses extending RAS reset/precharge using an on-chip generated control signal. U.S. Pat. No. 5,522,064 (Aldereguia et al.) describes a memory controller having timing registers to allow for the dynamic setting of memory timings for a plurality of memory chips that differ in size and speed. U.S. Pat. No. 5,563,831 (Ting) reveals a timing reference circuit which maintains a higher voltage at the gates of the isolation MOSFET's in the memory array during the precharge period and returns the voltage to a lower level before the end of the inactive period. This patent is assigned to the same assignee as the current invention.

SUMMARY OF THE INVENTION

It is an object of the present invention to provide circuits and methods to protect dynamic random access memory cell data from being destroyed when the minimum $t_{RAS}$ specification is not being adhered to, by holding off the already issued Row Precharge command until such time that $t_{RAS}$ is satisfied.

Another object of the present invention is to provide a reference capacitor which tracks the bitline capacitance of a memory array cell.

A further object of the present invention is to provide a high isolation voltage $V_h$, which is used for both the bitline isolation device and the transistor in the charging circuit.

A yet further object of the present invention is to provide a transistor in the charging circuit, which tracks the bitline isolation device.

These objects have been achieved by providing a timing reference circuit with a delay $\tau$, where this delay tracks the bitline restore time of the memory array cell, a row activation control logic which holds off the row precharge cycle until time $\tau$ has elapsed, insuring that the bitline signals are fully restored, and an internal circuitry which provides a high isolation voltage for the bitline isolation devices and for a charging transistor in the timing reference circuit.

DESCRIPTION OF THE PREFERRED EMBODIMENT

Figure 1:
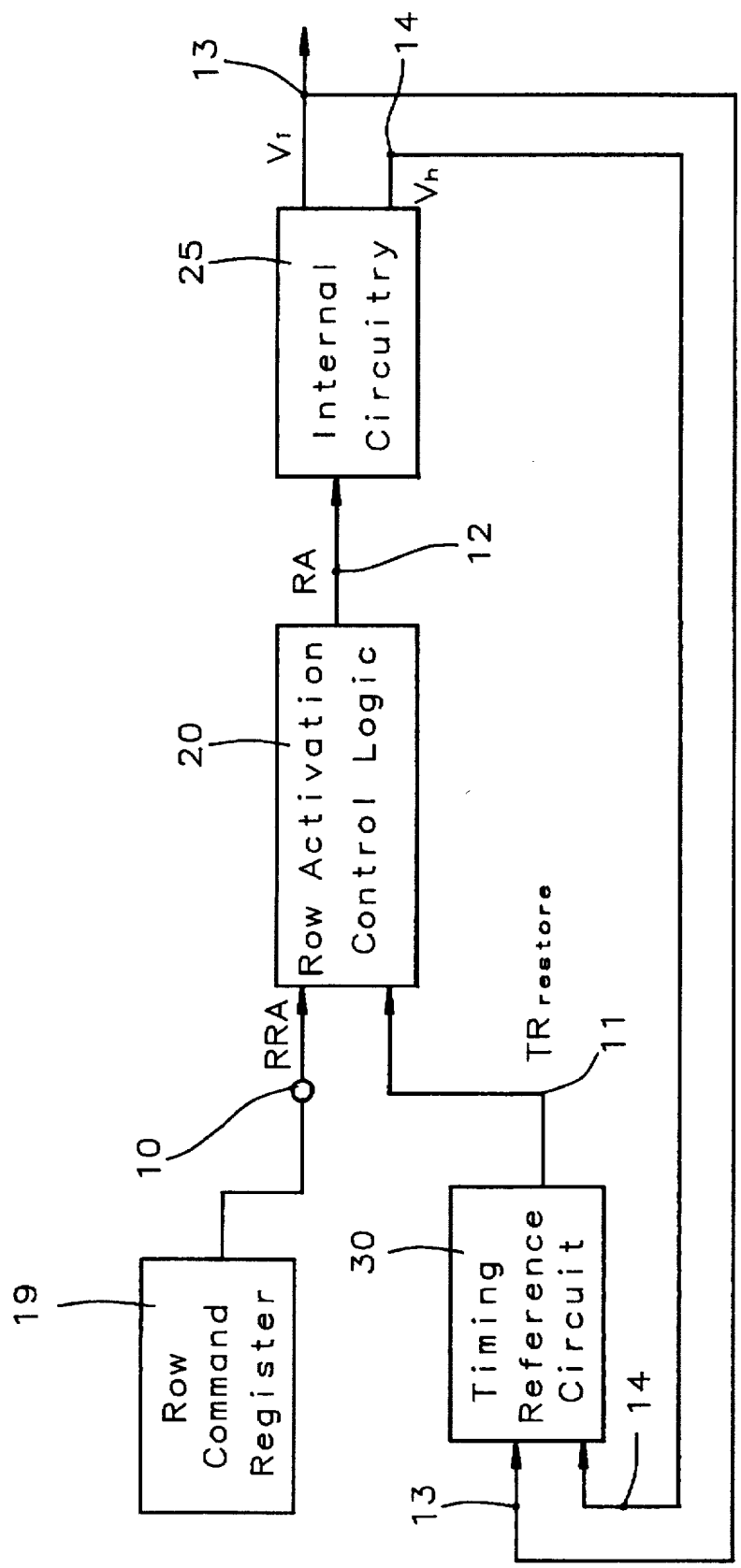
FIG. 1 is a high level block diagram of the present invention.

Referring now to FIG. 1, there is shown a high level block diagram of the present invention. The memory array $t_{RAS}$ protection circuit consists of a timing reference circuit 30 to track a bitline restore time of a memory array cell, a row command register 19 which stores the row activation and row precharge commands, a row activation control logic 20 to produce a row control timing of a memory array, and internal circuitry 25 to produce a high isolation voltage $V_h$ and a gating signal $V_i$.

Timing reference circuit 30 has input 13 ($V_i$), input 14 ($V_h$), and output 11 ($TR_{restore}$), which provides a logical one and zero voltage level. Output 11 is connected to block 20. Row command register 19 provides a row command received signal 10 (RRA) to block 20. Row activation control logic 20 has input 10 (RRA), input 11 ($TR_{restore}$), and output 12 (RA) which is connected to block 25. Output 12 also provides a logical one and zero voltage level. Input 10 comes from a row command register (not shown), issuing a logical one voltage level during an active period of the memory cycle and a logical zero voltage level during the inactive period of the memory cycle.

Figure 2:
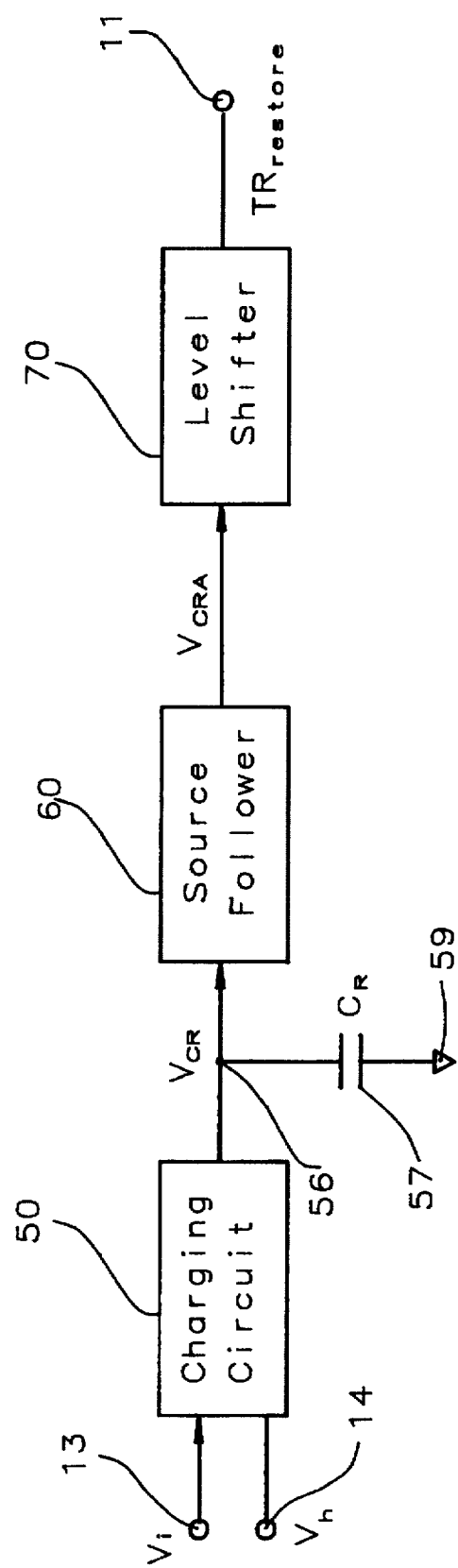
FIG. 2 is a block diagram of the timing reference circuit of the present invention.

Referring now to FIG. 2, the block diagram of timing reference circuit 30 is described. The timing reference circuit consists of charging circuit 50, reference capacitor 57, source follower 60, and level shifter 70. The function of the timing reference circuit is to provide a delay time $\tau$ which tracks the row activation time $t_{RAS}$, where $t_{RAS}$ is the minimum time required for restoring the bitline signals. $\tau$ is defined as the time from the rise of RRA to the rise of $TR_{restore}$, the input to the row activation control logic.

Charging circuit 50 has input 13 ($V_i$), input 14 ($V_h$), and output $V_{CR}$. Output $V_{CR}$ is connected to reference capacitor 57, which emulates the bitline capacitance of a memory array. The other side of reference capacitor 57 is connected to the reference potential 59 (ground). Output $V_{CR}$ also connects to source follower 60, which in turn connects through output $V_{CRA}$ to level shifter 70. Output 11 of the level shifter is $TR_{restore}$.

Charging circuit 50 provides the current to charge reference capacitor 57. Its charge-time tracks the bitline restore time, because the capacitance of the reference capacitor approximates the bitline capacitance of the memory array. When the level shifter trip point is reached, $TR_{restore}$ is switched and the bitline signals are fully restored (and integrity of the cell data is guaranteed). Source follower 60 maintains the correct DC voltage level $V_{CRA}$ for level shifter 70. Level shifter 70 provides at output 11 ($TR_{restore}$) logic voltage level signals suitable for row activation control logic 20 input.

Figure 3:
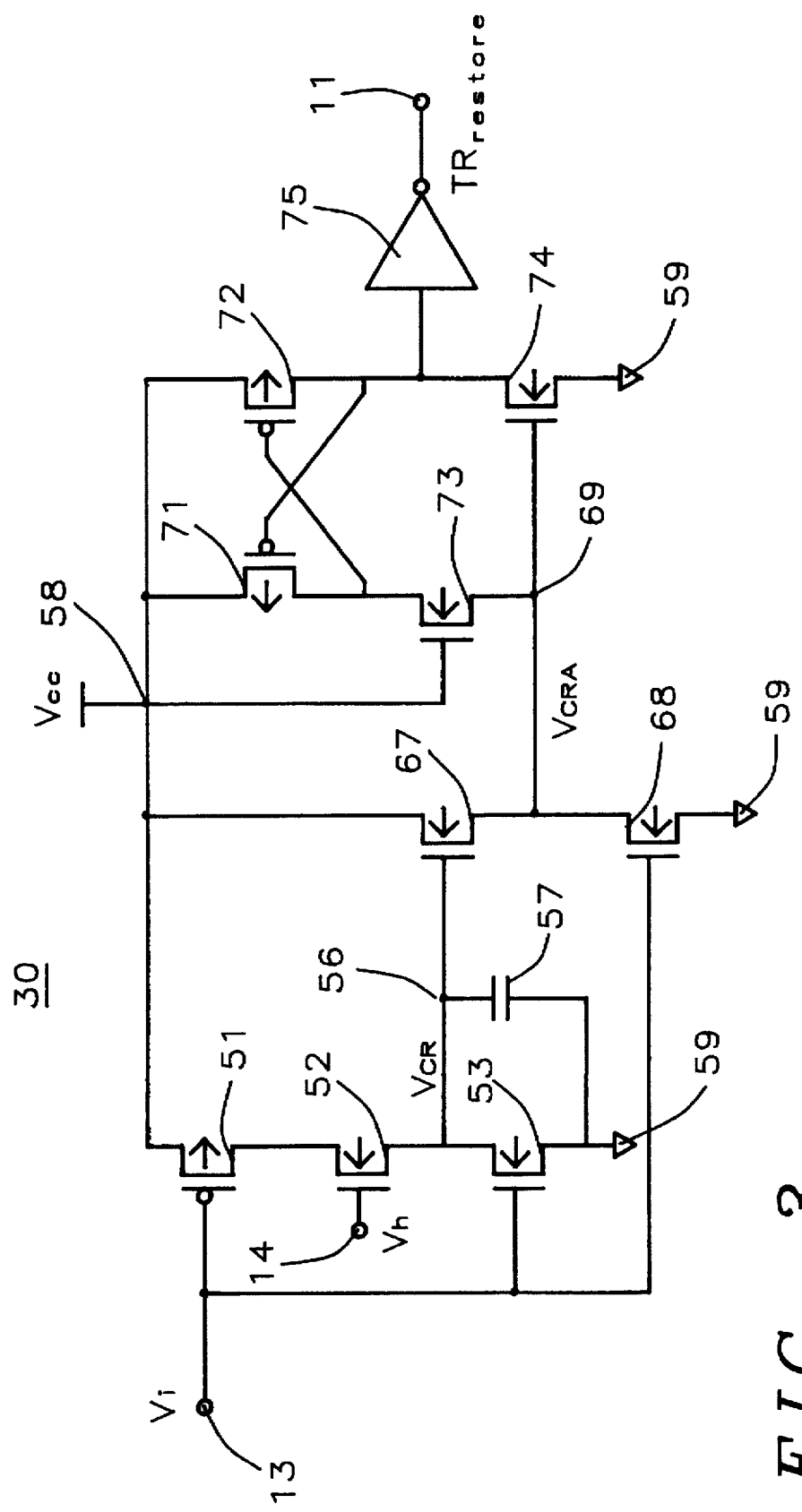
FIG. 3 is a circuit diagram of FIG. 2 of the present invention.

FIG. 3 is a detailed circuit diagram of the timing reference circuit of FIG. 2. The charging circuit of FIG. 2 is made up of transistors 51, 52, and 53; the source follower of FIG. 2 consists of transistors 67 and 68; while the level shifter of FIG. 2 is made up of transistors 71–74 and inverter 75.

Referring now to FIG. 3, input 13 ($V_i$) is shown connected to the gate of p-channel transistor 51 and the gate of n-channel transistor 53. Input 14 ($V_h$) is connected to the gate of n-channel transistor 52. Transistor 52 tracks the size of the isolation transistor of the memory array bitline, and thus controls the current flow into reference capacitor 57. Transistors 51–53 are connected in series with each other, where the source of transistor 51 is connected to voltage supply 58 ($V_{CC}$). The connection between the source of transistor 52 and the drain of transistor 53 is terminal 56 ($V_{CR}$). The source of transistor 53 is connected to reference voltage 59, typically ground. When input 13 ($V_i$) is near ground, p-channel transistor 51 is conducting and n-channel transistor 53 is turned off. When input 14 ($V_h$) is at potential $V_H$ reference capacitor 57 starts to charge and the voltage at node 56 rises. The risetime is designed to match the bitline restore time. This is assured because the size and type of n-channel transistor 52 matches the isolation transistor for the bitline and because the size of the reference capacitor approximates the capacitance of the bitline. In addition, both transistor 52 and the isolation transistor receive the same gate voltage $V_h$.

The gate of n-channel transistor 67 of the source follower is connected to terminal 56, the drain-source path of this transistor is connected between voltage supply 58 and terminal 69 ($V_{CRA}$). The drain-source path of n-channel transistor 68 is connected between terminal 69 and reference voltage 59. Input 13 ($V_i$) connects to the gate of n-channel transistor 68. $V_{CRA}$ is designed to be a threshold drop (transistor 67) from $V_{CR}$ to maintain an appropriate DC level for the next stage, level shifter 70. Since input 13 ($V_i$) is at or near zero potential, transistor 68 is non-conducting and providing a high impedance to ground for node 69.

Level shifter 70 consists of two p-channel transistors 71 and 72, and two n-channel transistors 73 and 74. The sources of transistors 71, 72 are connected to voltage supply 58, the gate of one transistor is connected to the drain of the other transistor. The gate of n-channel transistor 73 is connected to voltage supply 58, while the drain-source is connected between the drain of transistor 71 and terminal 69. The drain-source of n-channel transistor 74 is connected between the drain of transistor 72 and the reference supply 59. Inverter 75 is connected between the drain of transistor 72 and output 11. When node 69 goes high, transistor 73 turns off and transistor 74 starts conducting, bringing a potential near ground to the input of inverter 75 and the gate of transistor 71. Transistor 71 now turns on and a voltage close to $V_{CC}$ is applied to the gate of transistor 72, turning it off. The low potential at the input to inverter 75 is thus maintained and the inverter output goes to a logical one voltage level. Transistor 73 was turned off by the rising of node 69, thus isolating node 69 from voltage at the gate of transistor 72.

Figure 4:
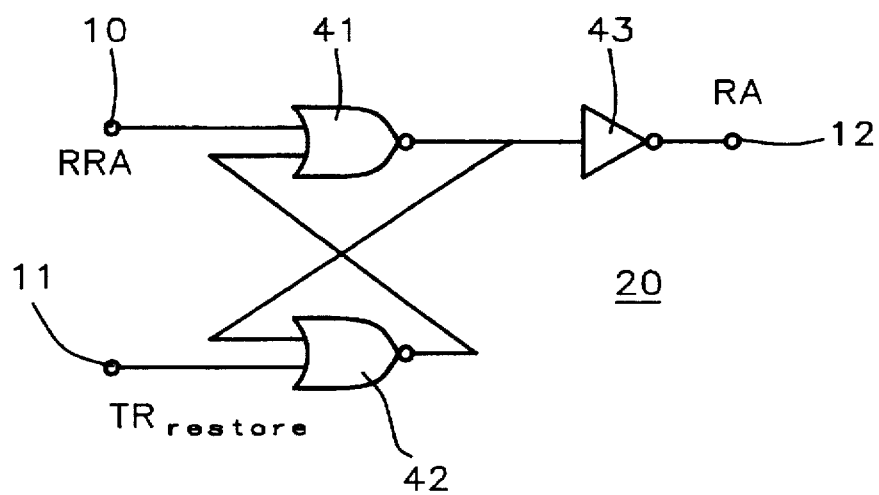
FIG. 4 is a circuit diagram of the row activation control logic of the present invention.

Referring now to FIG. 4, we show a circuit diagram of row activation control logic 20. Input 10 (RRA) feeds one input of a first two-input NOR gate 41 and input 11 ($TR_{restore}$) connects to one input of a second two-input NOR gate 42. The output of each NOR gate connects to the remaining input of the other NOR gate, forming a logic feedback loop. The output of the first NOR gate 41 feeds a logic inverter 43. Its output goes to output 12 (RA) of row activation control logic 20.

Figure 5:
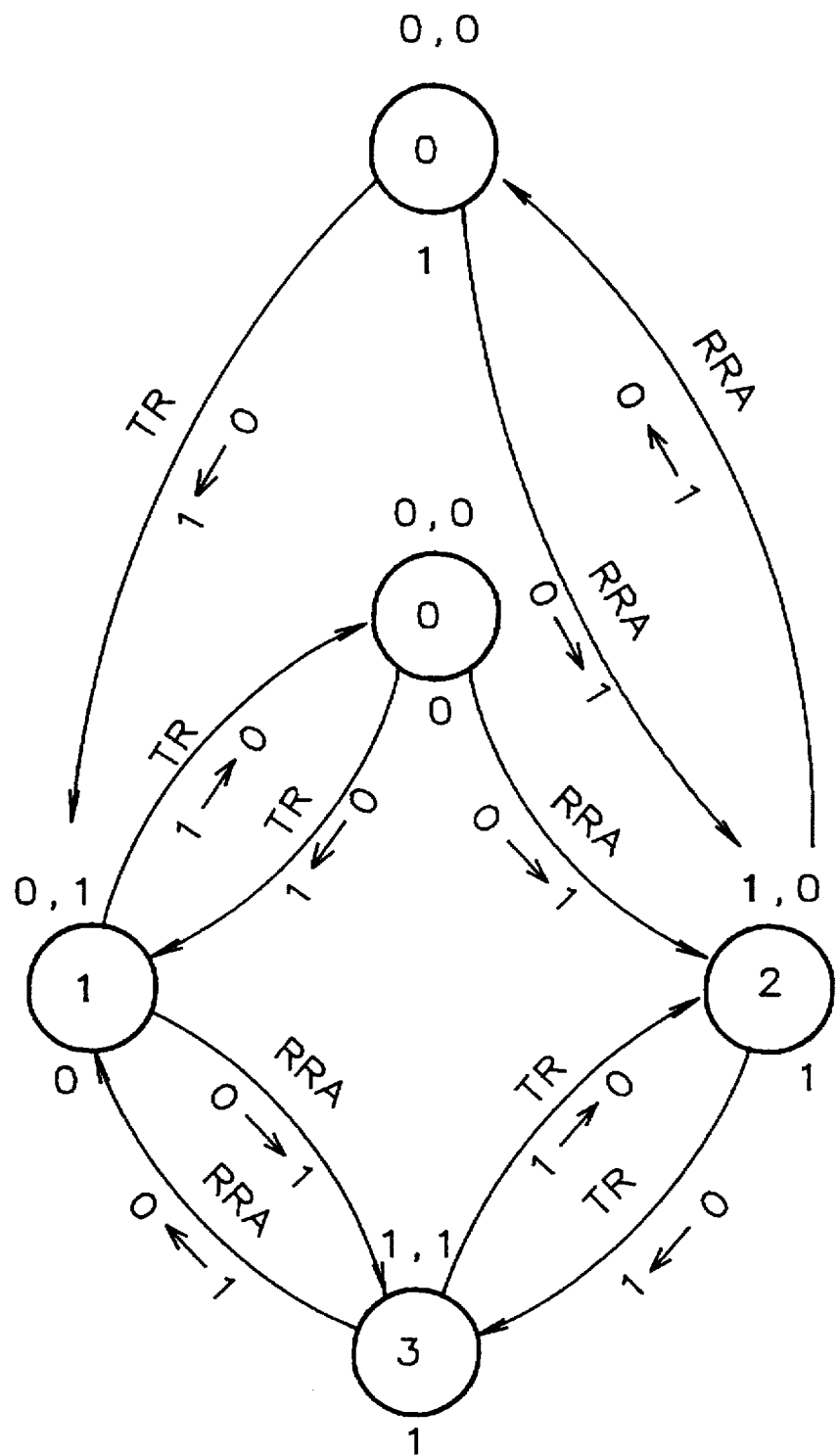
FIG. 5 is a state diagram of FIG. 4, relating input transitions to the next state and the corresponding output.

The state diagram for row activation control logic 20 is depicted in FIG. 5. The number within the circle designates the "state" of the row activation control logic; the left number above the circle indicates the logic level of first input RRA, and the right number indicates the logic level of second input $TR_{restore}$. The transitions for $TR_{restore}$ are labeled TR for the sake of brevity. The bottom number is the logic level of output RA. There are two "zero" states: one where the output RA=0, designated as $0_0$, and the other where the output RA=1, designated as $0_1$. Note that $0_0$ cannot be reached directly from state 2, and conversely that $0_1$ cannot be reached directly from state 1. This characteristic is important for the functioning of the row activation control logic and is demonstrated in FIG. 7a and 7b.

Figure 6:
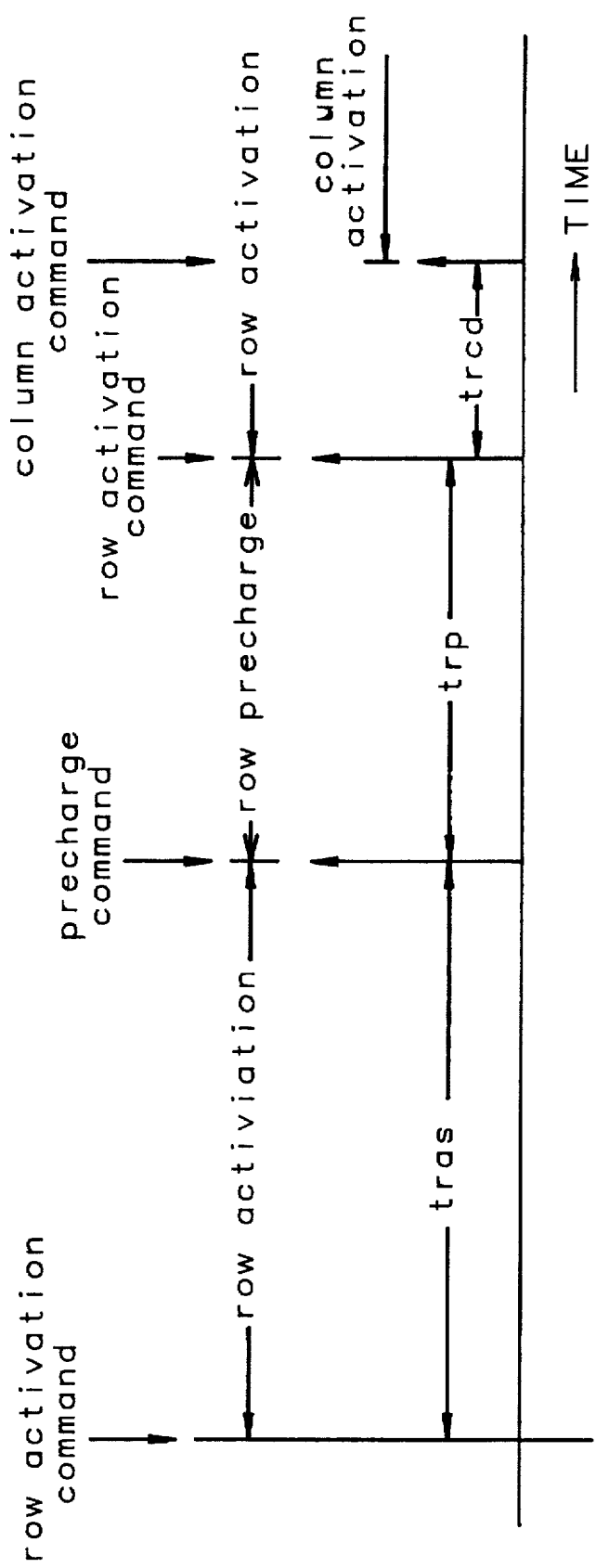
FIG. 6 is a diagram showing the nomenclature for the different sections of a conventional memory cycle.

FIG. 6 is a diagram showing the nomenclature for the different sections of a conventional memory cycle. $t_{RAS}$ specifies the duration of the row activation period $t_2$. The ROW ACTIVATION command starts the row activation period and the ROW PRECHARGE command starts the row precharge period (RRA, input 10). In the prior art, if for some reason the external row precharge commands do not obey the minimum $t_{RAS}$ specification, the bitline signals would not be fully restored and the memory array's cell data could deteriorate. The present invention saves the data from deterioration because row activation control logic 20 together with internal circuitry 25 and timing reference circuit 30 produce a positive going $TR_{restore}$ τ nanoseconds after RRA goes to logical 0. This positive $TR_{restore}$ keeps output RA up and thus delays execution of the ROW PRECHARGE command until the $t_{RAS}$ specification is satisfied and the bitline signals are fully restored.

Figure 7A:
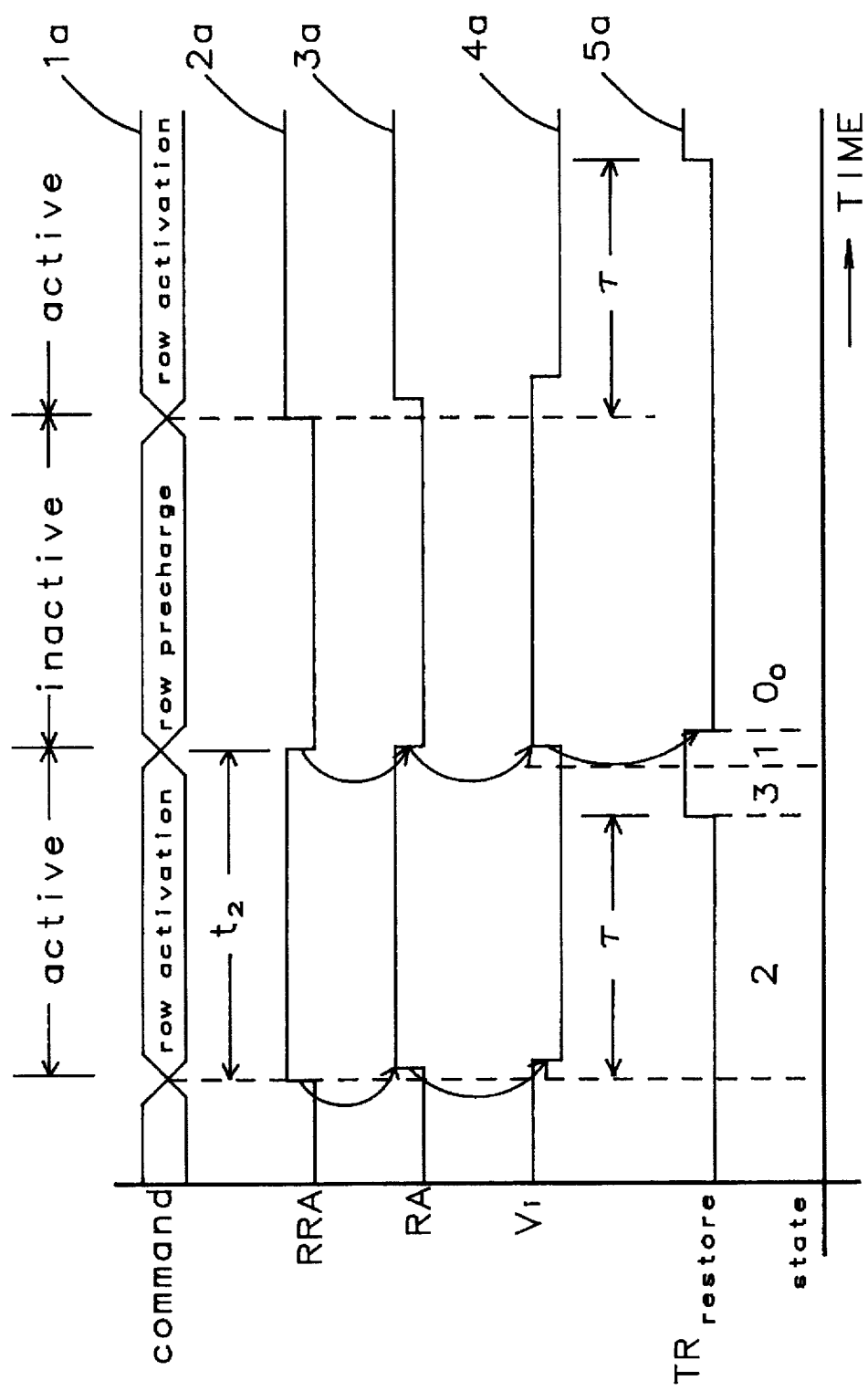
FIG. 7a is a view of the input and output signals of the high level block diagram as shown in FIG. 1, when the active period is longer than the bitline restore time $\tau$.

Referring now to FIG. 7a, Curves 1a to 5a demonstrate the action of the present invention under the condition where the command ROW ACTIVATION period $t_2$ satisfies the $t_{RAS}$ specification. See Curves 1a and 2a. After time $t_2$, RAA drops followed by RA dropping (Curve 3a). This is because $TR_{restore}$ is up after delay τ (Curve 5a) and the state diagram moves from state 3 to state 1 (RA=0). RA falling causes $V_i$ to drop and $V_i$ drops $TR_{restore}$ (Curves 3a, 4a, 5a).

Figure 7B:
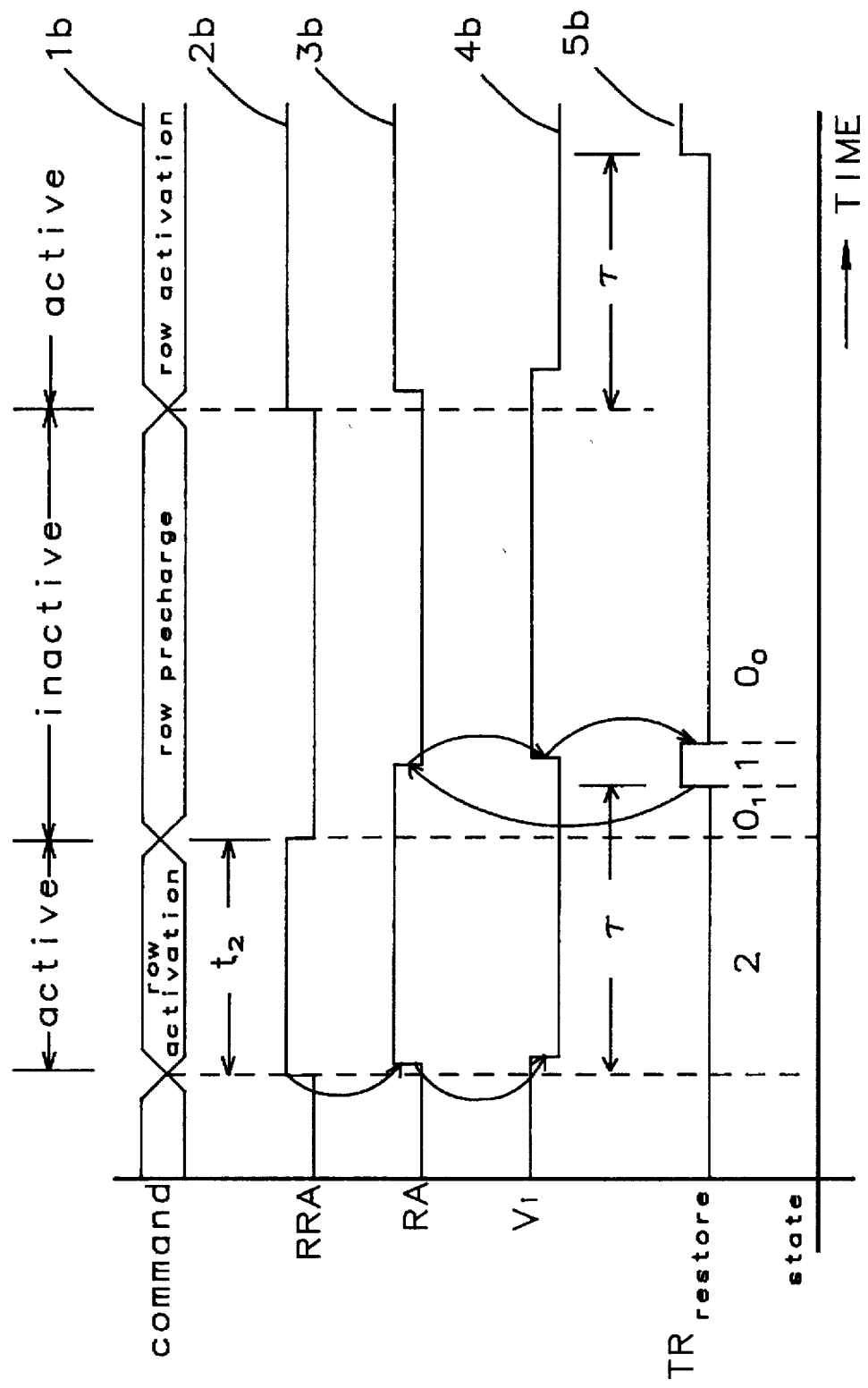
FIG. 7b is a view of the input and output signals of the high level block diagram as shown in FIG. 1, when the active period is shorter than the bitline restore time $\tau$.

Referring now to FIG. 7b, Curves 1b to 5b demonstrate the action of the present invention when the command ROW ACTIVATION period $t_2$ does not satisfy the $t_{RAS}$ specification, i.e. ROW PRECHARGE starts before the bitline signals are fully restored. The drop of RRA (Curve 2b) after time $t_2$ does not cause RA to drop (Curve 3b), because the drop causes a return from state 2, with RA=1, to state $0_1$. When $TR_{restore}$ rises (Curve 5b), and the row activation control logic moves from state 0 to 1, then RA is dropped (Curve 3b). Dropping of RA returns to 0 first $V_i$ and then TR$_{restore}$, see Curves 3b, 4b, 5b. RA has been held at logical one voltage level long enough to allow completion of the bitline restore. When RA drops to logical zero voltage level, the held off ROW PRECHARGE command is allowed to execute.

The circuits and the method of the present invention, as explained above, accomplish several salient and novel features: The row precharge command can be issued before the t$_{RAS}$ specification is satisfied. The invention allows for internal timing control for optimization between t$_{RP}$ and t$_{RAS}$. The output of timing reference circuit 30 provides a delay of duration τ, from the time when the row command register (not shown) provides a logical one voltage level to input 10 (RRA) to the time when the output 11 of the timing reference circuit provides a logical one voltage level. Output 12 of row activation control logic 20 will stay at a logical one voltage level when the row command register provides a logical zero voltage level until the timing reference output switches to a logical one voltage level. The high isolation voltage of output 14 is used in bitline isolation devices in shared sense amplifiers in a dynamic random access memory. The timing reference circuit delay τ tracks the bitline restore time. A shortened t$_{RAS}$ time will not destroy memory array cell data.

The circuits and method described apply to any of the dynamic random access memories such as, but not limited to, synchronous dynamic random access memory arrays, synchronous graphics random access memory arrays, extended data out dynamic random access memory arrays, and fast page mode dynamic random access memory arrays.

While the invention has been particularly shown and described with reference to the preferred embodiments thereof, it will be understood by those skilled in the art that various changes in form and details may be made without departing from the spirit and scope of the invention.

What is claimed is:

1. A method of protecting data in a memory, comprising:
   receiving a row activation command to begin an active period in said memory;
   generating a restore complete signal upon completion of restoring bit lines in said memory, wherein said restoring requires a time τ;
   receiving and registering a row precharge command, wherein said row precharge command may be received prior to completion of said bit line restoring; and
   using said restore complete signal and the registered row precharge command to initiate precharging of said bit lines.

2. A memory array t$_{RAS}$ protection circuit comprising:
   a timing reference circuit to track a bitline restore time of a memory array cell, with a first input, a second input, and an output, said output of said timing reference circuit providing a logical one voltage level and a logical zero voltage level;
   a row activation control logic to produce a row control timing of a memory array, with a first input, a second input, and an output, said second input of said row activation control logic connected to said output of said timing reference circuit, said output of said row activation control logic providing a logical one voltage level and a logical zero voltage level;
   a row command register issuing a logical one voltage level during an active period of a memory cycle and a logical zero voltage level during an inactive period of said memory cycle connected to said first input of said row activation control logic; and
   an internal circuitry to produce a high isolation voltage and a gating signal for said timing reference circuit, with an input, a first output, and a second output, said input of said internal circuitry connected to said output of said row activation control logic, said first output of said internal circuitry connected to said first input of said timing reference circuit, and said second output of said internal circuitry connected to said second input of said timing reference circuit.

3. The circuit of claim 2, wherein said timing reference circuit comprises:
   a voltage potential;
   a reference potential;
   a charging circuit with a first input, a second input, and an output, said first input of said charging circuit connected to said first input of said timing reference circuit, and said second input of said charging circuit connected to said second input of said timing reference circuit, wherein said charging circuit charges a reference capacitor;
   said reference capacitor having a first terminal connected to said output of said charging circuit and a second terminal connected to said reference potential, wherein said reference capacitor emulates a bitline capacitance;
   a source follower with a first input, a second input, and an output, said first input of said source follower connected to said output of said charging circuit, said second input of said source follower connected to said first input of said timing reference circuit, wherein said source follower maintains a direct current voltage level; and
   a level shifter with an input and an output, said input of said level shifter connected to said output of said source follower, said output of said level shifter connected to said output of said timing reference circuit, wherein said level shifter provides logic voltage level signals.

4. The circuit of claim 3, wherein said charging circuit comprises:
   a first p-channel transistor having a source-drain path and a gate, said source of said first p-channel transistor connected to said voltage potential, said gate of said first p-channel transistor connected to said first input of said charging circuit;
   a first n-channel transistor having a drain-source path and a gate, said drain-source of said first n-channel transistor connected between said drain of said first p-channel transistor and said output of said charging circuit, and said gate of said first n-channel transistor connected to said second input of said charging circuit; and
   a second n-channel transistor having a drain-source path and a gate, said drain-source of said second n-channel transistor connected between said source of said first n-channel transistor and said reference potential, said gate of said second n-channel transistor connected to said first input of said charging circuit.

5. The circuit of claim 3, wherein said source follower comprises:
   a third n-channel transistor having a drain-source path and a gate, said drain-source of said third n-channel transistor connected between said voltage reference and said output of said source follower, and said gate of said third n-channel transistor connected to said first input of said source follower; and
   a fourth n-channel transistor having a drain-source path and a gate, said drain-source of said fourth n-channel transistor connected between said source of said third n-channel transistor and said reference potential, and said gate of said fourth n-channel transistor connected to said second input of said source follower.

6. The circuit of claim 3, wherein said level shifter comprises:

a second p-channel transistor having a source-drain path and a gate, said source of said second p-channel transistor connected to said voltage potential;

a fifth n-channel transistor having a drain-source path and a gate, said drain-source of said fifth n-channel transistor connected between said drain of said second p-channel transistor and said input to said source follower, and said gate of said fifth n-channel transistor connected to said voltage potential;

a third p-channel transistor having a source-drain path and a gate, said source-drain of said third p-channel transistor connected between said voltage potential and said gate of said second p-channel transistor, said gate of said third p-channel transistor connected to said drain of said second p-channel transistor;

a sixth n-channel transistor having a drain-source path and a gate, said drain-source of said sixth n-channel transistor connected between said gate of said second p-channel transistor and said reference potential, and said gate of said sixth n-channel transistor connected to said input of said level shifter; and an inverter with an input and an output, said input of said inverter connected to said gate of said second p-channel transistor and said output of said inverter connected to said output of said level shifter.

7. The circuit of claim 2, wherein said row activation control logic comprises:

a first NOR gate with a first input, a second input and an output, said first input of said first NOR gate connected to said first input of said row activation control logic;

a second NOR gate with a first input, a second input and an output, said first input of said second NOR gate connected to said output of said first NOR gate, said second input of said second NOR gate connected to said second input of said row activation control logic, said output of said second NOR gate connected to said second input of said first NOR gate; and an inverter with an input and an output, said input of said inverter connected to said output of said first NOR gate, said output of said inverter connected to said output of said row activation control logic.

8. The circuit of claim 2, wherein said output of said timing reference circuit provides a delay of a duration τ, from when said row command register provides said logical one voltage level to when said output of said timing reference circuit provides said logical one voltage level.

9. The circuit of claim 2, wherein said output of said row activation control logic will stay at said logical one voltage level when said row command register provides a logical zero voltage level at the same time when said timing reference output provides a logical zero voltage level.

10. The circuit of claim 2, wherein said high isolation voltage is used in bitline isolation devices in shared sense amplifiers in a dynamic random access memory.

11. The circuit of claim 8, wherein said delay of duration τ tracks said bitline restore time.

12. The circuit of claim 3, wherein said reference capacitor tracks said capacitance of said bitline.

13. The circuit of claim 4, wherein said first n-channel transistor tracks the size of an isolation device.

14. A method of protecting a memory array $t_{RAS}$ time, comprising:

providing a timing reference circuit to track a restore time of bitlines of a memory array cell, with a first input, a second input, and an output $TR_{restore}$, said output of said timing reference circuit providing a logical one voltage level and a logical zero voltage level;

providing a row activation control logic to produce a row control timing of a memory array, with a first input RRA, a second input, and an output RA, said second input of said row activation control logic connected to said output of said timing reference circuit, said output of said row activation control logic providing a logical one voltage level and a logical zero voltage level;

providing a row command register issuing a logical one voltage level during an active period of a memory cycle and a logical zero voltage level during an inactive period of said memory cycle, said row command register connected to said first input of said row activation control logic; and providing an internal circuitry to produce a high isolation voltage and a gating signal for said timing reference circuit, with an input, a first output, and a second output, said input of said internal circuitry connected to said output of said row activation control logic, said first output of said internal circuitry connected to said first input of said timing reference circuit, and said second output of said internal circuitry connected to said second input of said timing reference circuit.

15. The method of claim 14, wherein said output RA is held at a logical one voltage level when said input RRA goes to a logical zero voltage level, until said output $TR_{restore}$ goes to a logical one voltage level.

16. The method of claim 14, wherein said bitlines are restored when said output $TR_{restore}$ of said timing reference circuit provides said logical one voltage level.

17. The method of claim 14, wherein said data of a memory array cell is save from deterioration when said output $TR_{restore}$ of said timing reference circuit provides said logical one voltage level.

18. The method of claim 14, wherein said memory array is a dynamic random access memory array.

* * * * *